United States Patent [19]

Kosky et al.

[11] Patent Number: 5,478,513

[45] Date of Patent: Dec. 26, 1995

[54] CVD DIAMOND GROWTH ON HYDRIDE-FORMING METAL SUBSTRATES

[75] Inventors: Philip G. Kosky; Thomas R. Anthony, both of Schenectady, N.Y.

[73] Assignee: General Electric Company, Worthington, Ohio

[21] Appl. No.: 415,119

[22] Filed: Mar. 29, 1995

Related U.S. Application Data

[63] Continuation of Ser. No. 71,941, Jun. 3, 1993, abandoned, which is a continuation of Ser. No. 806,388, Dec. 13, 1991, abandoned.

[51] Int. Cl.[6] ............................. B29C 35/00; C23C 16/26
[52] U.S. Cl. .......................... 264/81; 427/249; 427/255; 427/255.1; 427/122; 423/446; 428/408; 117/920
[58] Field of Search .................................. 427/249, 255, 427/255.1, 122; 423/446; 428/408; 117/920; 264/81

[56] References Cited

U.S. PATENT DOCUMENTS

| | | | |
|---|---|---|---|
| 4,434,188 | 2/1984 | Kamo et al. | 427/39 |
| 4,550,014 | 10/1985 | Baughman et al. | |
| 4,707,384 | 4/1987 | Schachner et al. | 428/408 |
| 4,830,702 | 5/1989 | Singh et al. | 427/42 |
| 4,842,937 | 6/1989 | Meyer et al. | 428/408 |
| 4,847,671 | 7/1989 | Pattanayak et al. | 357/38 |
| 4,925,701 | 5/1990 | Jansen et al. | 427/249 |
| 4,939,763 | 7/1990 | Pinneo et al. | 378/161 |
| 4,958,592 | 9/1990 | Anthony et al. | 427/55 |
| 5,130,111 | 7/1992 | Pryor | 427/249 |
| 5,204,145 | 4/1993 | Gasworth | 427/577 |
| 5,221,501 | 6/1993 | Feldman et al. | 264/1.2 |

FOREIGN PATENT DOCUMENTS

| | | |
|---|---|---|
| 0320657 | 6/1989 | European Pat. Off. |
| 0327110 | 8/1989 | European Pat. Off. |
| 0449571 | 10/1991 | European Pat. Off. |
| 60-210597 | 10/1985 | Japan. |
| 61-163273 | 7/1986 | Japan. |
| 62-119 | 1/1987 | Japan. |
| 63-057399 | 11/1988 | Japan. |

OTHER PUBLICATIONS

Morrish et al, Applied Physics Letters, vol. 59, No. 4, 22 Jul. 1991, pp. 417–419.

Primary Examiner—Roy V. King

[57] ABSTRACT

A method for producing CVD diamond film on a substrate comprised of a hydride-forming metal. The substrate provides for easy release of the CVD diamond coating formed thereon upon exposure to a hydrogen pressure. Self-supporting CVD diamond films of large dimension are easily obtained without dissolving the substrate. The substrate can be used in conventional CVD reactors.

4 Claims, No Drawings

CVD DIAMOND GROWTH ON HYDRIDE-FORMING METAL SUBSTRATES

This is a continuation of Ser. No. 08/071,941 filed on Jun. 3, 1993, now abandoned, which is a continuation of Ser. No. 07/806,388 filed, on Dec. 13, 1991, now abandoned.

FIELD OF THE INVENTION

This invention relates to an improved method and apparatus for producing diamond films and the products obtained therefrom. More particularly, this invention relates to chemical vapor deposition techniques and equipment for producing diamond films from a hydrocarbon-hydrogen gas mixture on a heated hydride-forming metal substrate, in which film growth is followed by exposing the diamond-coated substrate to hydrogen before the removal of the film.

BACKGROUND OF THE INVENTION

Recently, efforts directed toward the growth of diamond at low pressures, where it is metastable, have increased dramatically. Although the ability to produce diamond by low-pressure synthesis techniques has been known, drawbacks including extremely low growth rates prevented wide commercial acceptance. Recent developments have led to higher growth rates, thus spurring recent industrial interest in the field. Additionally, the discovery of an entirely new class of solids, know as "diamond-like" carbons and hydrocarbons, is an outgrowth of such recent work.

Low pressure growth of diamond is an example of what has been dubbed "chemical vapor deposition" or "CVD" in the field. Three predominant CVD techniques have found favor in the literature. One of these techniques involves the use of a dilute mixture of hydrocarbon gas (typically methane) and hydrogen wherein the hydrocarbon content usually is varied from about 0.05% to 1.5% in the atomic ratio of carbon to hydrogen. The gas is introduced via a quartz tube located just above a hot tungsten filament which is electrically heated to a temperature ranging from between about 1750° to 2400° C. The gas mixture disassociates at the filament surface and diamonds are condensed onto a heated substrate placed just below the hot tungsten filament. The substrate (often molybdenum) is heated to a temperature in the region of about 400° to 1100° C. U.S. Pat. No. 4,434,188 which describes in detail a CVD process of causing diamond nucleation and growth from a heated gas mixture in contact with a substrate.

The second technique involves the imposition of a plasma discharge to the foregoing filament process. The plasma discharge serves to increase the nucleation density, growth rate, and it is believed to enhance formation of diamond films as opposed to discrete diamond particles. Of the plasma systems that have been utilized in this area, there are three basic systems. One is a microwave plasma system, the second is an RF (inductively or capacitively coupled) plasma system, and the third is a d.c. plasma system. The RF and microwave plasma systems utilize relatively complex and expensive equipment which usually requires complex tuning or matching networks to electrically couple electrical energy to the generated plasma. Additionally, the diamond growth rate offered by these two systems can be quite modest.

The third method in use is direct deposit from acetylene as a hydrocarbon rich oxyacetylene flame. In this technique, conducted at atmospheric pressure, a specific part of the flame is played on a substrate on which diamonds may condense at rates as high as 100 microns/hr or more. See Y. Matsui, A. Yuuki, M. Sahara, Y. Hirose, Japan Journal of Applied Physics, vol. 28, p. 178 (1989).

In general, processes for the chemical vapor deposition of diamond involve selection of operating parameters such as the selection of a precursor gas and diluent gases, the mixture proportions of the gases, gas temperature and pressure, the substrate temperature and means of gas activation. These parameters are adjusted to provide diamond nucleation and growth on a substrate. Mixture proportions and conditions must provide atomic hydrogen to stabilize the surface of the diamond film and preferably minimize the deposition of graphite. Codeposition of graphite is more evident if the hydrocarbon (methane) concentration is increased above about 3%.

It is well known that CVD diamond tends to nucleate on certain substrate materials more readily than others and that good bonding to the substrate is necessary during the growth period, particularly when growing thick films. The diamond film grows in tension due to growth defects and the "intrinsic stain" induces a force which is proportional to the film thickness. Good bonding is necessary to avoid catastrophic release of the film as a result of this intrinsic strain. However, the diamond film can be so strongly attached to the substrate that at the end of the growth period it can not be removed without dissolving the substrate or where there is a significant differential in thermal expansion between the diamond and the substrate, the diamond film may crack during cool down. The use of release agents will promote the eventual removal of the film from the substrate but may cause the diamond to be so poorly bonded during growth that it causes a catastrophic release. Substrates of molybdenum have been favored in producing thin diamond films because the CVD diamond tends to nucleate readily on this material. However, removal of thick films from molybdenum substrates has posed problems due to strong carbide bonds which cause cracking on cool down and/or require dissolution of the substrate to obtain self-supporting films.

It is desirable to produce thick CVD diamond films which are easily removed from a substrate, do not release prematurely during deposition and do not crack upon cool down.

SUMMARY OF THE INVENTION

It is an object of this invention to provide a method for producing a CVD diamond coating on a substrate wherein the release of the diamond coating from the substrate is simplified and controllable and is accomplished without fracture.

A further object of the present invention is to provide self-supporting, crack-free, CVD diamond films of unique composition, preferably of large area, suitable for use in electronic applications.

A further object of the present invention is to provide a substrate and apparatus for the deposition of diamond coatings which permit controlled self-release of diamond coatings.

Other objects will be apparent from the detailed disclosure and claims which follow.

The above objects are achieved through the use of a substrate for growing CVD diamond comprised of a hydride-forming metal. The use of such a substrate in an otherwise conventional CVD reactor allows for easy removal of the diamond coating deposits therein by exposure to hydrogen after growth upon cooling of the coating. Removal can be accomplished by simply cooling the diamond coated substrate in a hydrogen until the diamond-coating self-releases from the substrate.

The CVD diamond films produced have trace amounts of the substrate metal therein, which are detectable by Laser-Assisted Inductively Coupled Plasma Mass Spectrometry (parts per trillion). Thick CVD diamond films of large area can be obtained without etching away the substrate with acid and without leaving acid residues.

DETAILED DESCRIPTION OF THE PREFERRED EMBODIMENTS

One aspect of the invention is the use of novel substrates for CVD diamond growth. These substrates comprise a hydride-forming metal, preferably niobium, titanium, zirconium, hafnium, vanadium, tantalum, palladium or alloys thereof, including alloys with non-hydride-forming metals such as Nb-Co; Nb-Cr; Nb-Fe; Nb-Ni; Nb-Re; Nb-Si; Nb-Sn; Nb-U; Nb-V and the like. These metals are desired for their high hydrogen solubility at temperatures below those used in growing the CVD diamond, and for their high reactivity with hydrogen at these temperatures to form hydrides as compared to molybdenum. It is probable, although not certain, that it is this hydrogen solubility and reactivity to form hydrides which allows diamond deposits to be more easily removed from these substrates than conventional molybdenum substrates. The substrates of the present invention provide self-release of a diamond coating thereon by controlled cooling in hydrogen. These substrates are adapted for use in a CVD reactor and may have a conventional surface finish or preferentially a highly polished surface and/or a conventional configuration.

The substrate may be an alloy of one or more of the hydride-forming metals or may contain the hydride-forming metal as part of a composite. Alloys and composites show advantage in that the differential expansion and/or contraction between the substrate and diamond coating during processing can be selected and preferably minimized. Excessive differential shrinkage may be a problem when the diamond coated substrate is cooled. A composite substrate comprised of a thick diamond sheet and thin overlayer of a hydride-forming metal such as niobium provide essentially no differential contraction with a CVD diamond film grown thereon.

The substrates may provide a surface area within a wide range of greater than 1 square millimeter to more than 2500 square inches. The substrates can be used in any apparatus suitable for use in the nucleation and growth of CVD diamonds.

The apparatus for the synthesis of CVD diamond provided by this invention comprises a substrate of the preferred hydride-forming metals described above. The remaining components are common to conventional equipment. These include a sealed reaction chamber wherein the substrate is positioned, a means for heating the substrate, a means for impinging the heated substrate with an admixture of hydrocarbon-hydrogen gas and a means for exciting the gas which impinges this substrate for diamond nucleation and growth.

The reaction chamber provides access to the substrate supported therein. The substrate is preferably heated by the excitation means for the gas, but means for secondary heating of the substrate can be provided. Thermal radiation reflectors may optionally be positioned within the reactor to help heat the substrate. A gas admixture is introduced into the reaction chamber and directed at the substrate for impingement utilizing conduit, fed through gas inlets and outlets. The gas which impinges the substrate may be excited by simply directing it across a hot filament heated by electrical resistance positioned in close proximity to the substrate. Alternative means include ionization of the gas with microwave or RF energy to form a gas plasma. The components and configuration of the apparatus can vary widely. Examples of suitable configurations are described in U.S. Pat. Nos. 4,958,592, 4,847,671 and 4,830,702.

The method for synthesizing a CVD diamond film of this invention calls for growing a diamond coating on a substrate of a hydride-forming metal. This is accomplished employing techniques analogous to conventional CVD diamond growth processes wherein the substrate is heated and contacted with an excited hydrocarbon-hydrogen gas mixture under conditions of pressure, temperature and gas concentrations to promote the growth of a diamond coating on such substrate. Suitable procedures for this step include the method for synthesizing a diamond coating provided by this invention wherein preferred hydride-forming metals of niobium, titanium, zirconium, hafnium, vanadium, tantalum, palladium and alloys thereof are utilized as a substrate in the conventional deposition process.

In growing diamond coatings, conventional starting materials and process conditions are suitable. For example, hydrocarbon sources can include alkane series gases, for example, methane, ethane, propane; unsaturated hydrocarbons, for example, ethylene, acetylene, cyclohexene and benzene; and the like. Methane, however, is preferred. The atom ratio of carbon to hydrogen broadly ranges from about 1:1 (in a flame CVD system) to about 1:1000 and about 1:200 being preferred. This gaseous mixture optionally may be diluted with an inert gas such as argon. Hot filaments are normally formed of tungsten, or tantalum and are typically heated to a temperature between 1750° and 2400° C. U.S. Pat. No. 4,707,384 provides further details of conventional CVD conditions and techniques suitable for use herein. Growth rates in the range of about 0.1 to 10 microns per hour have been easily obtained at power requirements of only about 20 watts per $cm^2$ of substrate. Growth rates greater than 10 microns per hour can be used at higher power density.

The substrate temperature utilized for diamond growth typically ranges from about 400° to 1100° C., and is preferably in the range of 700° to 950° C. Pressures for the gaseous admixture generally range from about 0.01 to 1000 Torr, advantageously about 1 to 800 Torr. Details on conventional process conditions suitable for use herein can also be found in Angus et al., "Low Pressure Metastable Growth of Diamond and Diamond-Like Phases", Science, Vol. 241, pp. 913–921 (Aug. 19, 1988); and Bachman et al., "Thin Diamond Films", Chemical Engineering News, pages 24–39 (May 15, 1989).

Some hydride-forming metal substrates of this invention provide poor nucleation surfaces for diamond growth. These surfaces can be "activated" by either rubbing them with diamond dust (approximately 1 micron in size) or by applying a suspension of the dust and alcohol to the surface and ultrasonically agitating the substrate surface.

Once the diamond coating has been grown on the substrate, it is cooled; for example, in the case of niobium preferably to a temperature below about 600° C. and most preferably below about 400° C. At these temperatures, the hydrogen solubility shows rapid increase with decreasing temperature with details dependent on the particular hydride-forming metal or alloy. Solubility of hydrogen within niobium has been found to increase from about 5 to 100 scc/g on cooling from about 1000° C. to room temperature. See Hansen and Anderson, "Constitution of Binary Alloys" (McGraw-Hill, , 2nd Ed., 1958) p. 787.

This cooled diamond coated substrate is exposed to hydrogen. This can be accomplished by maintaining the hydrogen pressure of the reactive gas mixture used to form the diamond, and preferably eliminating the hydrocarbon pressure. However, one may increase the hydrogen pressure. This may accelerate the separation of the diamond from the substrate, although there is the danger of formation of large amounts of metal hydride if a hydride-forming metal is exposed to large pressures of hydrogen for long periods. Hydrogen pressures in the range of 1 to 760 Torr are preferred. The hydrogen pressure can be increased in the reactor prior to cool down of the substrate. Another means for increasing the effective hydrogen pressure is to expose the diamond coated substrate to atomic hydrogen during cooling. The effective molecular hydrogen pressure is increased by the favorable equilibrium for the reaction, $H+H \rightleftharpoons H_2$.

Any exposure to hydrogen will aid the removal of the diamond coating. However, it is preferable in the case of niobium for such exposure to exceed 1 minute but not more than preferably 4 hours to provide significant enhancement in the separation of the diamond coating although these times are dependent on the particular hydride-forming metal used. Where the substrate shows some shrinkage differential, it is preferable to expose the substrate to a hydrogen pressure before cooling and differential shrinkage occurs. Some differential thermal shrinkage is desirable so as to break the presumably weak bonding in the interfacial hydride layer. This self-release occurs without fracture.

Although not wishing to be bound by theory, it is expected that the diffusion of hydrogen to the diamond-coated interface serves to disrupt the bonds formed between the substrate and the diamond by forming metal hydride. This diffusion may take place along the interface between the diamond and the substrate. An approximate model of the time it takes for hydrogen to diffuse through the hydride layer shows this time is proportional to $1/(Dp)$ where D is the diffusion coefficient of hydrogen along the interface region and p is the pressure of hydrogen. D is essentially constant, so the time to release a given sheet of diamond will decrease as the pressure of hydrogen increases. It is possible that the diamond separation from the substrate does not result in whole or in part, from hydrogen diffusion to the interface and hydride formation. Separation may be caused by other physical phenomenon such as hydrogen precipitation at the interface.

The process for producing diamond films of this invention will provide a self-supporting, crack-free CVD diamond film which may contain residues of hydride-forming metal obtained from the substrate and detectible by neutron activation or Laser-Assisted Inductively Coupled Plasma Mass Spectrometry (LAICPMS) using an Elan 5000 ICP-MS. These self-supporting crack-free CVD diamond films will be free of acid residues since it is not necessary to etch the substrate away with an acid to form the self-supporting structure and since the substrate is not etched away, it can be used over and over again. The self-supporting diamond films can have a surface area of from above 1 square millimeter to above 2500 square inches where desired. These diamond films can range from 1 to 10,000 microns in thickness with thicknesses greater than 100 microns being preferred. The films produced by the present invention are suitable for electronic purposes, i.e., as substrates for integrated circuitry, laser diodes and the like. Such films must be flawless, i.e. devoid of cracks, voids, grooves, etc.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

The entire disclosures of all applications, patents and publications, cited above and below, are hereby incorporated by reference.

EXAMPLES

Example 1

Four molybdenum and four niobium sample substrates were tested simultaneously within CVD reactor designed to accept these multiple substrates. The surface finish of these substrates were different from each other for test purposes. The four sample substrates of the two metals were arranged in separate vertical stacks. Each sample substrate was about 3.2 cm square. In each stack the top sample was metallurgically polished, the second substrate was also polished and in addition, rubbed with a slurry containing 2–20 micron diamond powder in 2-propanol to "activate" its nucleation behavior. The next substrate was electro-polished and the last one was grit blasted with sand. The roughness of the sample substrate was 2 pinches for the polished top, 1.3 to 1.70 μinches for the diamond nucleated substrate, 8 μinches for the molybdenum electro-polished substrate, 25 μinches for the niobium electro-polished substrate, 42 μinches for the grit blasted molybdenum substrate and 60 μinches for the grit blasted niobium substrate.

Gas containing about 1–2% methane in hydrogen at less than 0.1 bars is passed over a tungsten wire heated by passage of an electric current to bright white heat. Parallel filaments were located approximately midway between the substrates; the substrates were spaced at about 1–1.5 cm apart. After 6 days the methane flow was stopped and the system cooled down in pure hydrogen.

Except for the diamond activated molybdenum substrate, all of the molybdenum substrate samples showed flaking, cracking and/or sticking to the molybdenum. The diamond pre-nucleated sample on the molybdenum was attached by a relatively strong bond and indeed could not be readily detached. All of the samples on the niobium substrates released mostly as large pieces with minimal cracking or visible defects. A few pieces remained attached to the grit blasted niobium, presumably due to physical bonding to the rough surface. In all the niobium cases any observed cracking was clearly associated with mechanical aspects such as the growing diamond physically embracing a mechanical part and holding there. All flat surfaces released cleanly, the higher the polish on the niobium surface the less the possibility of mechanical bonding.

Example 2

In this example, refractory metal filaments were heated to above 2000° C. in the same reactor as in Example 1, in an atmosphere containing 1–2% methane in hydrogen at less than 0.1 bars. The substrates were two niobium plates each about 1"×4" with ½" square polished regions isolated from each other by grooves milled into the surface. They were pre-activated by treating with sub-micron diamond powder in 2-propanol. After growing diamond sheets for 24 days there was a power failure and the diamond sheets did not release as complete sheets but as a shower of small spalled pieces. Thus, the route at which the substrate/diamond combination is to be cooled is important in achieving the desired result.

Example 3

In another run, Example 2 was repeated using the same pressure, type of filaments and substrates. The atmosphere was about 1% methane in hydrogen and the substrates between 800° and 850° C. Diamond was grown to an eventual thickness of between 0.015 and 0.020". At the end of the experiment, the methane was shut off and the power to the filaments was reduced by about 10%/minute until the filaments no longer visibly glowed. A yield of approximately 40% of the possible ½ diamond plates was recovered, which released completely and successfully. The plates which failed did so due to mechanical deficiencies at the grooves separating them.

Example 4

Four polished niobium plates 1¾×9¼" were abraded ultasonically with 300-grit diamond dust suspended in a solution of ethanol in order to activate diamond nucleation. The niobium plates were suspended several millimeters from a planar array of hot tungsten filaments maintained above 2000° C. determined with a single band L&N optical pyrometer within a CVD reactor. A substrate cooler was placed behind the niobium plates to keep them at 935° C. as determined by a single band L&N optical pyrometer during the run. The gas pressure was below 0.1 bar and the gas composition was 1–2% methane by volume. After the plates had reached a thickness of 0.008" the substrates were cooled from 935° C. to room temperature over a four hour period in hydrogen. The CVD diamond film separated cleanly from the niobium substrate during cooling and had a thermal conductivity of 13.6 watts/cm/K.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A method for making a self-supporting chemical vapor deposition (CVD) diamond film, comprising the steps of:

(a) depositing a CVD diamond film on a hydride-forming metal substrate by introducing a hydrocarbon-hydrogen gas mixture over said hydride-forming metal substrate at a growth temperature;

(b) cooling the diamond coated substrate to a temperature below said growth temperature; and (c) continuously introducing hydrogen gas at a sufficient pressure and for a sufficient period of time to release said diamond film from said substrate.

2. A method as in claim 1, wherein said substrate comprises an alloy for minimizing the differential shrinkage between the CVD diamond film and the hydride-forming substrate when cooled.

3. A method as in claim 1, wherein the hydride-forming substrate is heated to 500° to 1100° C. during growth of the CVD diamond film and the diamond coated substrate formed is cooled to room temperature while the hydrogen pressure is increased from 10 Torr to 500 Torr.

4. the method of claim 1, wherein the hydride-forming substrate is a niobium substrate.

* * * * *